(12) United States Patent
Ross et al.

(10) Patent No.: US 8,327,247 B2
(45) Date of Patent: Dec. 4, 2012

(54) BIT PROBABILITY ESTIMATION METHOD FOR NOISY MODULATION CODE

(75) Inventors: John Anderson Fergus Ross, Niskayuna, NY (US); Aria Pezeshk, State College, PA (US)

(73) Assignee: General Electric Company, Niskayuna, NY (US)

( * ) Notice: Subject to any disclaimer, the term of this patent is extended or adjusted under 35 U.S.C. 154(b) by 741 days.

(21) Appl. No.: 12/414,284

(22) Filed: Mar. 30, 2009

(65) Prior Publication Data

US 2010/0251080 A1 Sep. 30, 2010

(51) Int. Cl.
*G06F 11/00* (2006.01)
(52) U.S. Cl. .................. 714/792; 714/786
(58) Field of Classification Search .......... 714/792, 714/786, 791, 793, 798, 800, 806, 752; 369/59.23
See application file for complete search history.

(56) References Cited

U.S. PATENT DOCUMENTS

| | | | |
|---|---|---|---|
| 6,246,731 B1 * | 6/2001 | Brianti et al. ........... | 375/341 |
| 6,891,483 B2 | 5/2005 | Noda et al. | |
| 7,127,665 B2 * | 10/2006 | Noda ...................... | 714/792 |
| 7,336,207 B2 | 2/2008 | Nakagawa | |
| 7,388,525 B2 * | 6/2008 | Miyauchi et al. ........ | 341/67 |
| 7,403,138 B2 | 7/2008 | Coene | |
| 2005/0157823 A1 * | 7/2005 | Sudhakar ............... | 375/341 |
| 2008/0122667 A1 | 5/2008 | Bentvelsen et al. | |

FOREIGN PATENT DOCUMENTS

| | | |
|---|---|---|
| WO | WO2007072277 | 6/2007 |
| WO | WO2008078234 | 3/2008 |

OTHER PUBLICATIONS

Bahl et al.; Optimal Decoding of Linear Codes for Minimizing Symbol Error Rate; IEEE Transactions on Information Theory, Mar. 1974; pp. 284-287.
Miyauchi et al.; Soft-Output Decoding of 17 Parity Preserve/Prohibit Repeated Minimum Transition Runlength (PP) Code; Japanese Journal of Applied Physics; vol. 43, No. 7B, 2004, pp. 4882-4883.
Miyauchi et al.; Application of Turbo Codes to High-Density Optical Disc Storage Using 17PP Code; Japanese Journal of Applied Physics; vol. 44, No. 5B, 2005, pp. 3471-3473.
Application of John Anderson Fergus Ross et al.; entitled "Joint DC Minimization and Bit Detection"; filed Mar. 30, 2009.
Application of Aria Pezeshk et al.; entitled "Method for Decoding Under Optical and Electronic Noise"; filed Mar. 30, 2009.

* cited by examiner

*Primary Examiner* — Dieu-Minh Le
(74) *Attorney, Agent, or Firm* — Joseph J. Christian (57) ABSTRACT

The present techniques provide systems and methods for decoding an optical data signal returned from an optical disc to retrieve source information. The decoding method is based on a 16 state trellis diagram, and may decode an optical data signal encoded through a modulation code where the input-to-output relationship is not convolutional, such as the 17 Parity Preserve/Prohibit (17pp) modulation code. A trellis diagram may enable non-convolutional trellis-modulated data to be more efficiently decoded. Further, the 16 state trellis diagram of the present techniques provides a unique path for each input-to-output bit pair, such that no information about input bits may be lost on parallel paths in a trellis diagram.

18 Claims, 5 Drawing Sheets

BIT PROBABILITY ESTIMATION METHOD FOR NOISY MODULATION CODE

BACKGROUND OF THE INVENTION

The present techniques relate generally to data transferred in communications systems. More specifically, the techniques relate to methods and systems for decoding data from communications systems.

As computing power has advanced, computing technology has entered new application areas, such as consumer video, data archiving, document storage, imaging, and movie production, among others. These applications have provided a continuing push to develop data storage techniques that have increased storage capacity. Further, increases in storage capacity have both enabled and promoted the development of technologies that have gone far beyond the initial expectations of the developers, such as gaming, among others.

The progressively higher storage capacities for optical storage systems provide a good example of the developments in data storage technologies. The compact disc (CD) format, developed in the early 1980s, has a capacity of around MB of data, or around 74-80 min. of a two channel audio program. In comparison, the digital versatile disc (DVD) format, developed in the early 1990s, has a capacity of around 4.7 GB (single layer) or 8.5 GB (dual layer). The higher storage capacity of the DVD is sufficient to store full-length feature films at older video resolutions (for example, PAL at about 720 (h)×576 (v) pixels, or NTSC at about 720 (h)×480 (v) pixels).

However, as higher resolution video formats, such as high-definition television (HDTV) (at about 1920 (h)×1080 (v) pixels for 1080p), have become popular, storage formats capable of holding full-length feature films recorded at these resolutions have become desirable. This has prompted the development of high-capacity recording formats, such as the Blu-ray Disc® format, which is capable of holding about 25 GB in a single-layer disc, or 50 GB in a dual-layer disc. As resolution of video displays, and other technologies, continue to develop, storage media with ever-higher capacities will become more important.

One developing storage technology that may better achieve future capacity requirements in the storage industry is based on holographic storage. Holographic storage is the storage of data in the form of holograms, which are images of three dimensional interference patterns created by the intersection of two beams of light in a photosensitive storage medium. In bit-wise holography or micro-holographic data storage, every bit may be written as a micro-hologram, or Bragg reflection grating, typically generated by two counter-propagating focused recording beams. The writing process may also involve encoding the data. For example, error correcting codes or modulation codes may be used to encode the data as it is stored in an optical disc. The data is then retrieved by using a read beam to reflect off the micro-hologram to reconstruct the recording beam, and typically involves decoding the data to retrieve the information originally stored.

Optical storage systems such as holographic storage systems may involve encoding and decoding of data signals. A decoding process may depend on the original encoding of source data. For example, the 17 Parity Preserve/Prohibit (17pp) code, which is one type of code used in encoding source data in some optical storage systems, may have a complex variable-length encoding process and may not have an obvious convolutional relationship. Though this encoding technique may be an efficient method of recording data, such encoding techniques may result in difficulties in decoding data to obtain original source data. Efficient decoding techniques which may be used for variable-length encoded data may be advantageous.

BRIEF DESCRIPTION OF THE INVENTION

A contemplated embodiment of the present techniques provides a method for decoding optical data. The method includes receiving the optical data that has been encoded as a 17 Parity Preserve/Prohibit (17pp) modulation code, and decoding the optical data based on a modulation trellis. The modulation trellis has paths corresponding to state transitions in the optical data, and has 16 states.

Another contemplated embodiment provides a system for bit estimation of optical data, including a detector, a decoder, and a memory register. The detector is configured to detect optical returns from an optical data disc, and the decoder, coupled to the detector, is configured to estimate source information from the optical returns. The memory register is accessible to the decoder, and includes instructions to estimate the source information from the optical returns based on a trellis diagram having 16 states.

In another contemplated embodiment, the present techniques provide a decoder for decoding data. The decoder includes a memory register having a decoding algorithm based on a 16 state trellis representation. The 16 state trellis representation corresponds to a nonconvolutional encoding of the data.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. More-over, it should be appreciated that such a development effort might be complex and time consuming, but would nevertheless be a routine undertaking of design, fabrication, and manufacture for those of ordinary skill having the benefit of this disclosure.

The present techniques disclose systems and methods for decoding data which has been encoded according to a variable-length encoding process or a non-convolutional modulation code. Though variable-length encoding processes such as the 17 Parity Preserve/Prohibit (17pp) encoder may enable the encoding of variable lengths of source data, and may be an efficient method of recording source data, the variable-length encoding characteristic does not provide an obvious trellis relationship. More specifically, a decoder may not be able to trace an obvious trellis to determine input-to-output relationships. This may result in difficulties in retrieving original source data from an output stream. Some embodiments of the present techniques involve decoding a data stream according to a state trellis relationship which may be used for a data stream encoded by a variable-length encoder. In one embodiment, a trellis relationship may have 16 states, where each input-to-output relationship has a unique branch in the trellis diagram. In decoding data, the present techniques may apply to any trellis-based code system, and is not limited to data encoded by a 17pp encoder given as an example in this disclosure.

Figure 1:
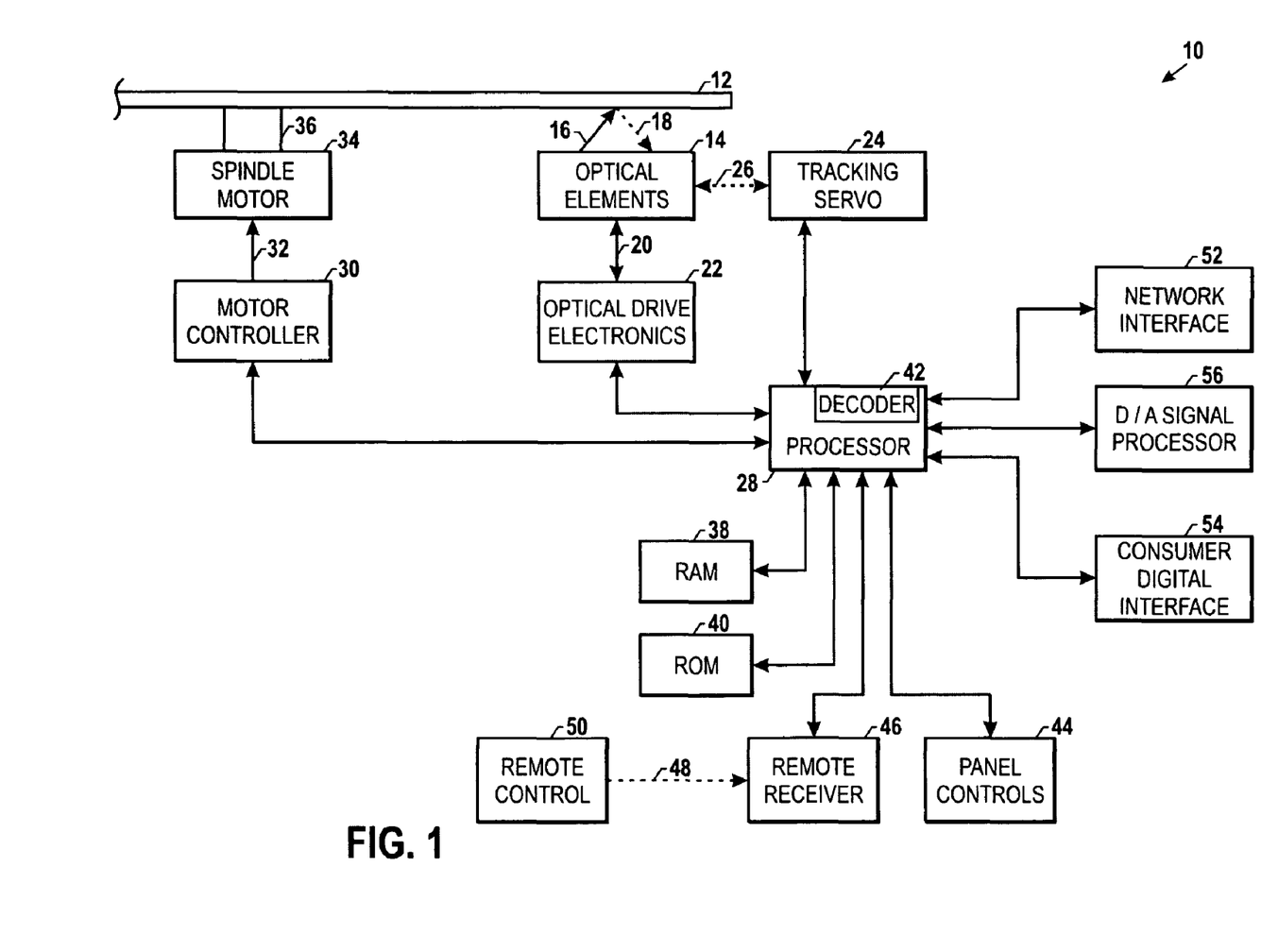
FIG. 1 is a block diagram of an optical disk reader, in accordance with embodiments of the present technique.

An optical reader system 10, which is an example of an optical system to which the present techniques apply, may be used to read data from optical storage discs 12 is depicted in FIG. 1. The optical reader system 10 may be a part of an optical storage system, which may include additional elements involved in writing or recording data. In an optical reader system 10, the data stored on the optical data disc 12 is read by a series of optical elements 14, which project a read beam 16 onto the optical data disc 12. A reflected beam 18 is picked up from the optical data disc 12 by the optical elements 14. The optical elements 14 may comprise any number of different elements designed to generate excitation beams, focus those beams on the optical data disc 12, and detect the reflection 18 coming back from the optical data disc 12. The optical elements 14 are controlled through a coupling 20 to an optical drive electronics package 22. The optical drive electronics package 22 may include such units as power supplies for one or more laser systems, detection electronics to detect an electronic signal from the detector, analog-to-digital converters to convert the detected signal into a digital signal, and other units such as a bit predictor to predict when the detector signal is actually registering a bit value stored on the optical data disc 12.

The location of the optical elements 14 over the optical data disc 12 is controlled by a tracking servo 24 which has a mechanical actuator 26 configured to move the optical elements back and forth over the surface of the optical data disc 12. The optical drive electronics 22 and the tracking servo 24 may be controlled by a processor 28 or may be controlled by dedicated servo electronics. The processor 28 also controls a motor controller 30 which provides the power 32 to a spindle motor 34. The spindle motor 34 is coupled to a spindle 36 that controls the rotational speed of the optical data disc 12. As the optical elements 14 are moved from the outside edge of the optical data disc 12 closer to the spindle 36, the rotational speed of the optical data disc may be increased by the processor 28. This may be performed to keep the data rate of the data from the optical data disc 12 essentially the same when the optical elements 14 are at the outer edge as when the optical elements are at the inner edge. The maximum rotational speed of the disc may be about 500 revolutions per minute (rpm), 1000 rpm, 1500 rpm, 3000 rpm, 5000 rpm, 10,000 rpm, or higher.

The processor 28 is connected to some form of memory storage device such as random access memory or RAM 38 and read only memory or ROM 40. The ROM 40 typically contains the programs that allow the processor 28 to control the tracking servo 24, optical drive electronics 22, and motor controller 30. Further, the ROM 40 also contains programs that allow the processor 28 to analyze data from the optical drive electronics 22, which has been stored in the RAM 38, among others. As discussed in further detail herein, such analysis of the data stored in the RAM 38 may include, for example, demodulation, decoding or other functions necessary to convert the information from the optical data disc 12 into a data stream that may be used by other units. The demodulation and decoding, or any other analysis or conversion of data, may be performed by a decoder 42 in the processor 28 or in some other component of the optical reader system 10. Algorithms, instructions, or data used in demodulation or decoding may be stored in the RAM 38 or the ROM 40, or any other memory component accessible to the processor 28 or the decoder 42 such as a memory storage device or buffer, or any other application specific hardware.

If the optical reader system 10 is a commercial unit, such as a consumer electronic device, it may have controls to allow the processor 28 to be accessed and controlled by a user. Such controls may take the form of panel controls 44, such as keyboards, program selection switches and the like. Further, control of the processor 28 may be performed by a remote receiver 46. The remote receiver 46 may be configured to receive a control signal 48 from a remote control 50. The control signal 48 may take the form of an infrared beam, or a radio signal, among others.

After the processor 28 has analyzed the data stored in the RAM 38 to generate a data stream, the data stream may be provided by the processor 28 to other units. For example, the data may be provided as a digital data stream through a network interface 52 to external digital units, such as computers or other devices located on an external network. Alternatively, the processor 28 may provide the digital data stream to a consumer electronics digital interface 54, such as a high-definition multi-media interface (HDMI), or other high-speed interfaces, such as a USB port, among others. The processor 28 may also have other connected interface units such as a digital-to-analog signal processor 56. The digital-to-analog signal processor 56 may allow the processor 28 to provide an analog signal for output to other types of devices, such as to an analog input signal on a television or to an audio signal input to an amplification system.

While the optical reader system is described in detail according to one embodiment, there are many other features and designs of optical reader systems that are all within the scope of the optical reading system.

Figure 2:
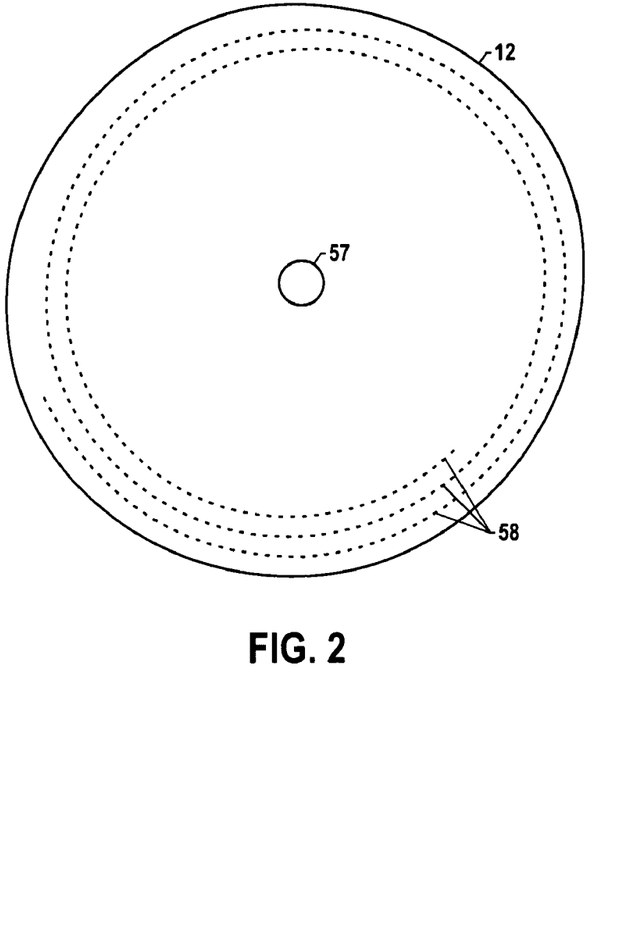
FIG. 2 illustrates an optical disk having data tracks, in accordance with embodiments of the present techniques.

The reader 10 may be used to read an optical data disc 12 containing data, as shown in FIG. 2. According to one embodiment, the optical data disc 12 is a flat, round disc with one or more data storage layers embedded in a transparent protective coating. The protective coating may be a transparent plastic, such as polycarbonate, polyacrylate, and the like. The data layers may include any number of surfaces that may reflect light, such as the micro-holograms used for bit-wise holographic data storage. The disc 12 may also include a reflective surface with pits and lands. A spindle hole 57 couples to the spindle to control the rotation speed of the disc 12. The data may be generally written in a sequential spiraling track 58 from the outer edge of the disc 12 to an inner limit, although individual concentric circular data tracks, or other configurations, may be used.

Writing data in an optical storage system typically involves encoding the data into a form that is recordable on an optical disc 12. In some embodiments, source data may be in the form of bits, and may be encoded as output symbols on the optical disc 12. An overview of how encoding and decoding of data may fit in an optical storage system is presented in the block diagram of FIG. 3. In storing source information, depicted as I, onto an optical storage disc 12, the source information I may first be converted into a format that may be stored on the disc 12. For example, source information I may be in the form of an electronic or digital signal, and may be encoded by a 17pp encoder to form an encoded output X, wherein X is then modulated and stored onto/into the disk. After reading, a sample set Y is detected and used to estimate the original source information I. The optical disc refers to the storage medium for the optical encoded data for which there are a number of types, variations and formats such as magneto-optical discs, compact discs (CD), laser discs, mini discs, digital versatile discs (DVD), Blu-ray Discs®, including the various holographic discs, and multilayer discs.

Figure 3:
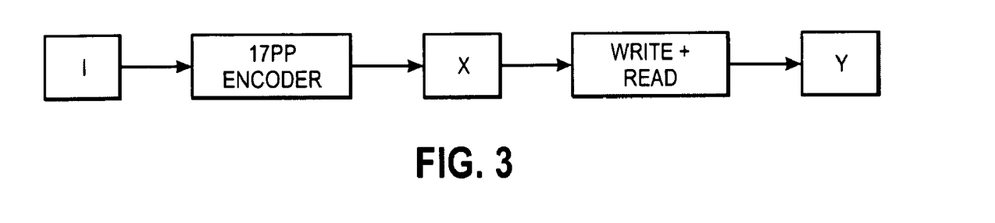
FIG. 3 is a flow chart of an overview of a method for encoding source information and writing and reading encoded output symbols, in accordance with embodiments of the present techniques.

An optical reader system 10 may retrieve the original information I by reading the disc 12. As the original information I had been encoded for storage on the disc 12, the reader 10 may read the information as symbol outputs Y, which must be decoded and/or demodulated to retrieve the original information vector I. The symbol outputs term Y may refer to the fact that the processes of writing and reading the 17pp encoded symbols X may result in interferences and distortions from the media, optics, and the electronics of an optical storage system, such that the received output symbols Y may include noise in addition to the originally encoded symbol outputs X. Such interferences may decrease the accuracy of estimating information I from the output symbols Y, and embodiments of the present technique may effectively convert symbol outputs to retrieve original information I, while reducing errors resulting from optical and electronic noise to improve the estimation of the original source information I.

In one embodiment, the encoding, writing, and reading process may be comparable to a Markov chain, where future states of an output may depend probabilistically on a present state, and independent of past states. A recursive algorithm may be used to compute the a posteriori probabilities of the states and transitions of a Markov chain, given detected data Y. For example, such a recursive algorithm is presented by Bahl, Cocke, Jelinek, and Raviv, in the article "Optimal Decoding of Linear Codes for Minimizing Symbol Error Rate," found on pages 284-287 in the March 1974 IEEE Transactions on Information Theory, and may be referred to as the "BCJR algorithm." The Bahl-Cocke-Jelinek-Raviv (BCJR) algorithm, along with embodiments of the present techniques, will be discussed in the equations and explanations below, although other recursive algorithms such as Soft Output Viterbi Algorithm (SOVA) are known in the art and within the scope of the optical reading system.

One embodiment of the present techniques involves estimating the original information I from the output symbols Y read from the optical disc 12. In some embodiments, the decoder 42 may be a maximum a posteriori (MAP) decoder, which may be used to decode the output symbols Y and estimate the original information I. In other embodiments, a decoder 42 may use other bit likelihood estimators, such as enhanced Viterbi algorithms. While the present techniques are not limited to any particular decoding scheme, one embodiment incorporates the BCJR algorithm to estimate bit probabilities. The a posteriori probabilities of the states and transitions of the encoded data X may be represented in equations (1)-(2) below:

$$Pr\{S_t = m \mid Y_1^\tau\} = Pr\{S_t = m; Y_1^\tau\} / Pr\{Y_1^\tau\} \qquad \text{equation (1)}$$
$$= \lambda_t(m)/Pr\{Y_1^\tau\}$$

$$Pr\{S_{t-1} = m'; S_t = m \mid Y_1^\tau\} = Pr\{S_{t-1} = m'; S_t = m; Y_1^\tau\}/Pr\{Y_1^\tau\} \qquad \text{equation (2)}$$
$$= \sigma_t(m', m)/Pr\{Y_1^\tau\}$$

In the above equation, $Pr\{S_t=m;Y_1^\tau\}$ represents the probability that the (trellis or state representation of the) encoded data is in state m at time t, given the detected data Y, and $Pr\{St_{t-1}=m';S_t=m;Y_1^\tau\}$ represents the probability that the encoded data transitions from state m' at time t−1 to state m at time t, given Y. The different states are denoted by m, and bits may transition from state m' to state m. The state and transition probabilities may be computed from the alpha, beta, and gamma functions, as defined by the BCJR algorithm:

$$\alpha_t(m)=Pr\{S_t=m;Y_1^t\} \qquad \text{equation (3)}$$

$$\beta_t(m)=Pr\{Y_{t+1}^\tau \mid S_t=m\} \qquad \text{equation (4)}$$

$$\lambda_t(m)=\alpha_t(m)\cdot\beta_t(m) \qquad \text{equation (5)}$$

Referring back to equation (2), $\sigma_t(m',m)$ may represent the a posteriori transition probabilities of trellis states, and may be computed with the alpha, beta, and gamma functions, $$\sigma_t(m',m)=\alpha_{t-}(m')\cdot\gamma_t(m',m)\cdot\beta_t(m), \qquad \text{equation (6)}$$

where $$\gamma_t(m',m)=Pr\{S_t=m;Y_t \mid S_{t-1}=m'\}. \qquad \text{equation (7)}$$

To compute the alpha, beta, and gamma functions, the following recursions may be used:

$$\alpha_t(m) = \sum_{m'} \alpha_{t-1}(m') \cdot \gamma_t(m', m) \qquad \text{equation (8)}$$

$$\beta_t(m) = \sum_{m'} \beta_{t+1}(m') \cdot \gamma_{t+1}(m, m') \qquad \text{equation (9)}$$

$$\gamma_t(m', m) = \sum_X p_t(m \mid m') \cdot q_t(X \mid m', m) \cdot R(Y_t, X) \qquad \text{equation (10)}$$

In the gamma function of equation (10), $p_t(m \mid m')$ are the Markov transition probabilities, and $q_t(X \mid m',m)$ is the distribution of the output symbols. Bit probability estimates are computed using the a posteriori transition probabilities $\sigma_t(m', m)$, and the a posteriori probability estimate for a bit may be obtained by summing all of the a posteriori transition probabilities corresponding to that same input bit. For example, a bit may have a "0" state or a "1" state, and the two a posteriori estimates may be represented by $APP_t(0)$ and $APP_t(1)$:

$$APP_t(b) = Pr\{I_t = b \mid Y_1^\tau\} \qquad \text{equation (11)}$$
$$= \sum_{X_b} \sigma_t(m', m)$$

If the probability of a bit having a 0 state, or $APP_t(0)$, is higher than the probability of a bit having a 1 state, $APP_t(1)$, then the decoder 42 may estimate that the bit b has a 0 state rather than a 1 state. The summation in equation (11) occurs over all σ$_t$(m',m) values where the input bit I$_t$ corresponding to the transition (m',m) is b, and ⌊X$_b$⌋ is the corresponding output of the Markov source for the transition (m',m). In some embodiments, a branch may have multiple input and output pairs, and the summation of σ$_t$(m',m) may take place over all combinations of input and output pairs for each branch. To estimate the probability of the state of a bit, all of the σ$_t$(m',m) values of the bit may be summed, and the decoder 42 will determine whether the probability of the bit having a 0 state is higher than the probability of the bit having a 1 state, or vice versa.

The output of the BCJR algorithm is not the source information itself, but rather the probability or likelihood of each bit state of the source information. The output of the BCJR algorithm is therefore referred to as a soft output. Typically, this soft output is determined by the algorithm using a trellis representation indicating state transitions of the encoding process. The trellis representation of the encoding process, which may be graphically depicted as a trellis diagram, may show the input-to-output relationship of a convolutional operation and the paths of state transitions for each combination of input and output pairs. The trellis diagram may depict different paths from one state to another for each time interval of an encoding process, and a decoder may use the paths of a trellis diagram to determine the encoding process by tracing data state transitions to obtain a soft output.

A trellis representation is typically determined when an input signal is decoded using a convolutional code. However, the data inputs and symbol outputs in some modulation techniques may not have an obvious convolutional relationship. A modulation code such as 17 Parity Preserve/Prohibit (17pp), for example, may enable source data to be modulated as a bit stream, such that at each step of the encoding, a variable number of data bits may be modulated. However, since the input-to-output relationship of the 17pp modulation encoding does not have an obvious convolutional relationship, the lack of an obvious trellis representation may increase the complexity of the demodulating and/or decoding of data, as a decoding algorithm may not be able to trace a trellis diagram to determine input-to-output relationships and determine the most probable input bits originally sent in the source information.

A decoding scheme using a trellis structure which duplicates the input-to-output relationship of the 17pp modulation scheme is desirable. Additionally, a decoding algorithm may require a large amount of memory to store the algorithm in the optical storage system, and a significant amount of time to compute and decode the data. To reduce the complexity of decoding trellis modulated (e.g., 17pp encoded) data, embodiments of the present techniques utilize a trellis structure having the minimum number of states for efficient decoding.

Figure 4:
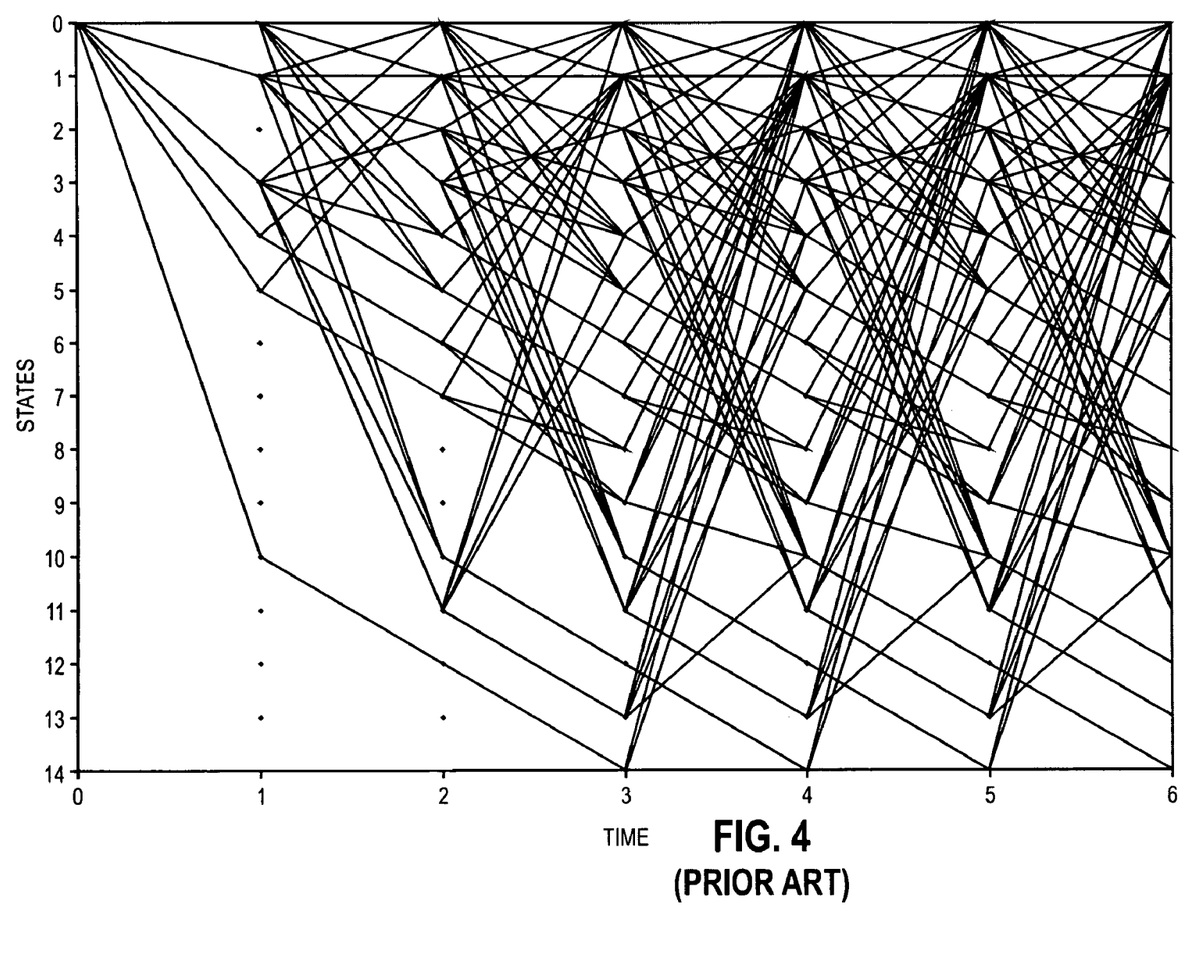
FIG. 4 is a trellis diagram having 15 states.
Figure 5:
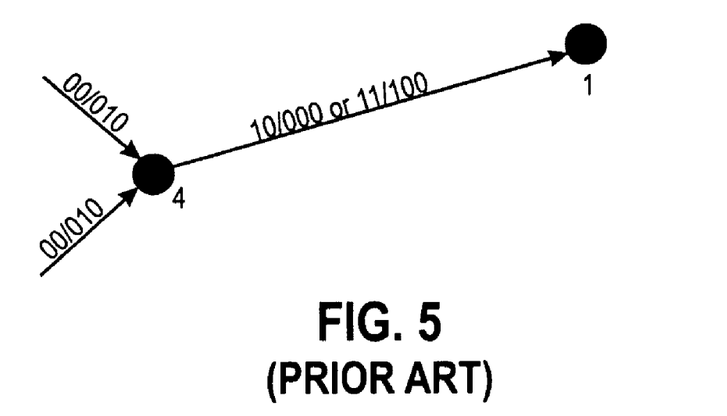
FIG. 5 is a depiction of a portion of a 15 state trellis diagram, where one branch is traversed for two input-to-output pairs.

Some attempts at creating a trellis diagram to duplicate the 17pp scheme have resulted in a 15 state trellis diagram, as presented in Miyauchi, et al, U.S. Pat. No. 7,388,525 B2. In the 15 state trellis diagram presented in FIG. 4, hereinafter referred to as the "Miyauchi trellis," states 0 through 14 are arranged along the y-axis across different time intervals of the encoding, arranged along the x-axis. More than one input-to-output pair may be associated with one branch. For example, as illustrated in FIG. 5, branch 4-1 of the Miyauchi trellis is traversed for two distinct input-to-output pairs [1 1]/[1 0 0] and [1 0]/[0 0 0], where the two input bits [1 1] produce the three output bits [1 0 0], and the two input bits [1 0] produce the three output bits [0 0 0]. Referring to equation (11), the sigma calculation for the 4-1 branch is identical for the two cases where the first input bit is 1, and the second input bit is either 0 or 1. As seen in equation (2), information about input bits may be lost when a parallel path occurs, as a transition from state m' to state m can occur in both cases when the input bit is either 0 or 1. Thus, the equation (2) may not determine the portion of the a posteriori probability corresponding to the second input bit for a branch with a parallel path. This means that the probability of the second input bit being a 0 would be equal to the probability of the second input bit being a 1, and a decoder would not be able to estimate the state of the second input bit on the 4-1 branch of the Miyauchi trellis.

Figure 6:
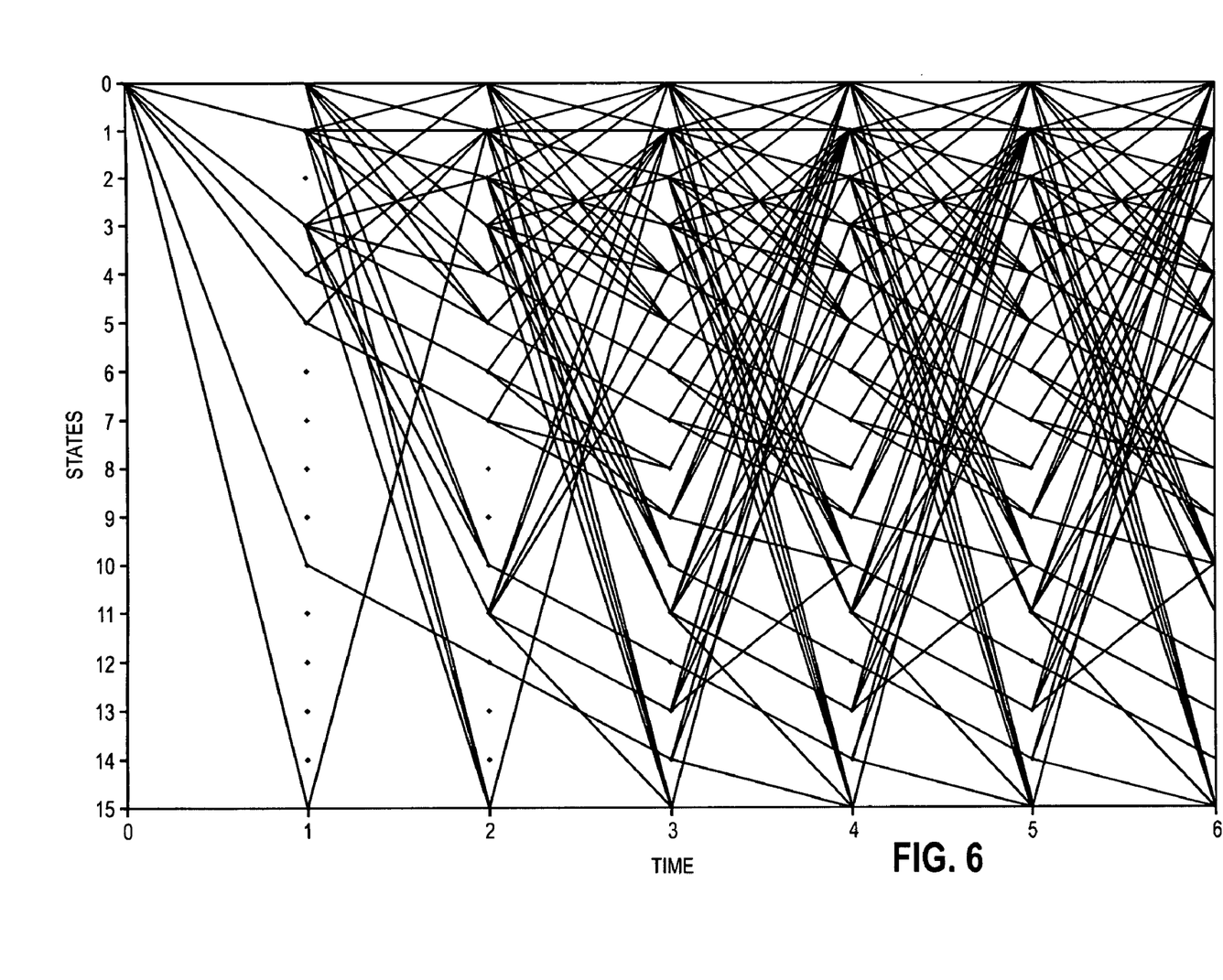
FIG. 6 is a trellis diagram having 16 states, in accordance with embodiments of the present techniques.
Figure 7:
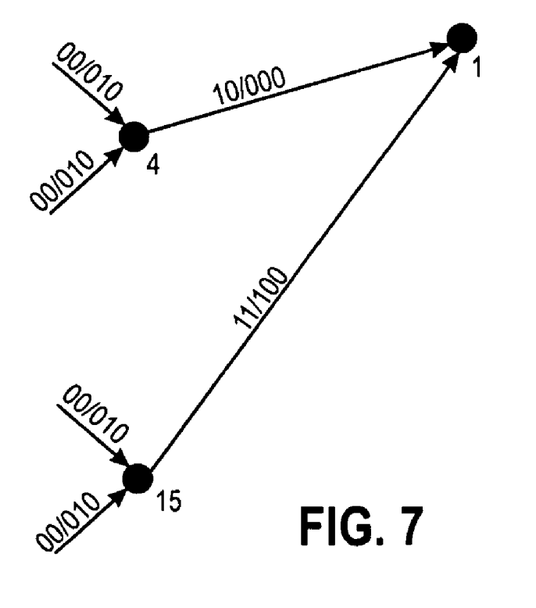
FIG. 7 is a depiction of a portion of a 16 state trellis diagram, where a unique branch is associated with each input-to-output pair, in accordance with embodiments of the present techniques.

In the present techniques, a 16 state trellis diagram associates a unique branch with all input-to-output pairs, such that a decoding algorithm may estimate the second input bit in a 17pp modulation scheme. An example of a state trellis diagram to be used in accordance with the present techniques is provided in the 16-state trellis diagram of FIG. 6, where states 0 through 15 are arranged along the y-axis across different time intervals of the encoding, arranged along the x-axis. In the 16 state trellis, all input-to-output pairs may have a unique path, such that both input bits may be estimated by a decoding algorithm. As seen in FIG. 7, the addition of branch 15-1 may enable branch 4-1 to have one input-to-output pair [1 0]/[0 0 0], and branch 15-1 to have one input-to-output pair [1 1]/[1 0 0]. The previous time state of the trellis may now transition to and exit from state 4 when the input-to-output pattern of the data encoding is [0 0 1 0]/[0 1 0 0 0 0], and the previous time state of the trellis may transition to and exit from state 15 when the input-to-output pattern is [0 0 1 1]/[0 1 0 1 0 0]. Since the 17pp code is a variable length code for which the length and output are determined by future incoming input bits, all states that had a transition to state 4 from the input-to-output pair [0 0]/[0 1 0] in the Miyauchi trellis would also have a transition to state 15 in the 16 state trellis of the present techniques. In the 16 state trellis, if the next two input bits are [1 0], the trellis transitions from state 4 to state 1 to generate an output of [0 0 0]. If the next two input bits are [1 1], the trellis would transition from state 15 to state 1 to generate an output of [1 0 0].

The addition of branch 15-1 may address the two input-to-output pair problem in the Miyauchi trellis. While the Miyauchi trellis had 53 branches, counting the transition from state 4 to state 1 as two branches as it represents two distinct input-to-output pairs, the current 16 state trellis has 59 branches. The transition table below may numerically illustrate the input-to-output pairs, and the transitions from a previous state to a present state. The new branch 15 is marked by an x in the "New Branches" column to depict the new branch added to create the 16 state trellis of the present techniques.

| Previous State | Input | Output | Present State | New Branches |
|---|---|---|---|---|
| 0 | 01 | 010 | 1 | |
| 0 | 10 | 001 | 0 | |
| 0 | 00 | 000 | 5 | |
| 0 | 00 | 010 | 4 | |
| 0 | 11 | 000 | 3 | |
| 0 | 11 | 001 | 10 | |
| 0 | 00 | 010 | 15 | x |
| 1 | 01 | 010 | 1 | |
| 1 | 10 | 001 | 0 | |
| 1 | 00 | 000 | 5 | |
| 1 | 00 | 010 | 4 | |
| 1 | 11 | 101 | 2 | |
| 1 | 11 | 001 | 10 | |

-continued

| Previous State | Input | Output | Present State | New Branches |
|---|---|---|---|---|
| 1 | 00 | 010 | 15 | x |
| 2 | 01 | 010 | 11 | |
| 2 | 10 | 001 | 0 | |
| 2 | 00 | 000 | 5 | |
| 2 | 00 | 010 | 4 | |
| 2 | 00 | 010 | 15 | x |
| 2 | 11 | 000 | 3 | |
| 2 | 11 | 001 | 10 | |
| 3 | 01 | 010 | 11 | |
| 3 | 10 | 001 | 0 | |
| 3 | 00 | 000 | 5 | |
| 3 | 00 | 010 | 4 | |
| 3 | 00 | 010 | 15 | x |
| 3 | 11 | 101 | 2 | |
| 3 | 11 | 001 | 10 | |
| 4 | 00 | 100 | 6 | |
| 4 | 10 | 000 | 1 | |
| 5 | 00 | 100 | 7 | |
| 5 | 01 | 100 | 1 | |
| 6 | 01 | 100 | 1 | |
| 6 | 00 | 100 | 8 | |
| 6 | 00 | 000 | 9 | |
| 7 | 11 | 100 | 1 | |
| 7 | 10 | 100 | 8 | |
| 7 | 10 | 000 | 9 | |
| 8 | 00 | 100 | 1 | |
| 9 | 01 | 010 | 1 | |
| 9 | 10 | 001 | 0 | |
| 9 | 11 | 101 | 2 | |
| 9 | 11 | 001 | 10 | |
| 10 | 01 | 000 | 12 | |
| 11 | 01 | 010 | 1 | |
| 11 | 10 | 001 | 0 | |
| 11 | 11 | 101 | 13 | |
| 11 | 00 | 000 | 5 | |
| 11 | 00 | 010 | 4 | |
| 11 | 00 | 010 | 15 | x |
| 12 | 11 | 000 | 14 | |
| 13 | 10 | 001 | 0 | |
| 13 | 00 | 000 | 5 | |
| 13 | 11 | 000 | 3 | |
| 13 | 11 | 001 | 10 | |
| 14 | 01 | 010 | 1 | |
| 14 | 00 | 010 | 4 | |
| 14 | 00 | 010 | 15 | x |
| 15 | 11 | 100 | 1 | x |

While the previous Miyauchi trellis created a trellis representation of state transitions corresponding to a non-convolutional encoding scheme (e.g., 17pp), the 16 state trellis of the present technique adds the new branches which enables the bit probability estimation for trellis modulated data without information loss on parallel paths. Furthermore, only one state has been added to the previous 15 state Miyauchi trellis to obtain a unique branch for each input-to-output pair. As decoding algorithms may be time and memory intensive, trellis relationships having a smaller number of states may be advantageous. Thus, the present techniques may enable more efficient systems or methods for decoding data where the length of input bits is variable for each output sample.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for decoding optical data, comprising:
   receiving the optical data wherein the optical data is encoded as a 17 Parity Preserve/Prohibit (17 pp) modulation code; and
   decoding the encoded data based on a modulation trellis having paths corresponding to state transitions in the optical data, wherein the modulation trellis has 16 states.

2. The method of claim 1, wherein an encoding process of the optical data is a variable-length encoding process.

3. The method of claim 2, wherein the encoding process is not convolutional.

4. The method of claim 1, wherein the state transitions of each input-to-output data pair in the encoding process has a unique path in the modulation trellis.

5. The method of claim 1, wherein the decoding is based on a recursive decoding algorithm substantially similar to the Bahl, Cocke, Jelinek, and Raviv (BCJR) algorithm.

6. The method of claim 1, comprising:
   outputting estimates of source information, wherein the source information is encoded as optical data on an optical data disc.

7. A system for bit estimation of optical data, comprising:
   a detector configured to detect optical returns from an optical data disc, wherein the optical returns comprise encoded source information, wherein the optical returns comprise encoded optical data having a 17 Parity Preserve/Prohibit (17 pp) modulation code;
   a decoder coupled to the detector and configured to estimate source information from the optical returns; and
   a memory register accessible to the decoder, comprising instructions to estimate the source information from the optical returns, wherein the instructions are based on a trellis diagram having 16 states.

8. The system of claim 7, wherein the optical returns comprise reflections of a light beam from a target data position on the optical data disc.

9. The system of claim 7, wherein the source information comprises a plurality of input bits.

10. The system of claim 9, wherein the instructions are configured to estimate a state of the input bits based on input-to-output paths in the trellis diagram.

11. The system of claim 10, wherein the input-to-output paths in the trellis diagram represent an encoding process of the input bits.

12. A decoder for decoding data, comprising:
   a memory register comprising a decoding algorithm based on a 16 state trellis representation, and wherein the 16 state trellis representation corresponds to a nonconvolutional encoding of the data, wherein the data was encoded according to a 17 Parity Preserve/Prohibit (17 pp) encoder.

13. The decoder of claim 12, wherein the decoder is a maximum a posteriori (MAP) decoder.

14. The decoder of claim 12, wherein the data is holographic data.

15. The decoder of claim 12, wherein a source data is encoded as optical data on an optical data disc.

16. The decoder of claim 15, wherein the decoding of the optical data produces an estimate of the source data.

17. The decoder of claim 12, wherein the 16 state trellis representation has one branch for each input-to-output pair of data bits.

18. The decoder of claim 12, wherein the decoding algorithm produces a probability of a state of bits in source data.

* * * * *